United States Patent
Song

(10) Patent No.: US 8,072,771 B2
(45) Date of Patent: Dec. 6, 2011

(54) UPRIGHT CIRCUIT BOARD ASSEMBLY STRUCTURE

(75) Inventor: Wen-Joe Song, Taipei (TW)

(73) Assignee: KINGBRIGNT ELECTRONICS Co. Ltd., New Taipei (TW)

( * ) Notice: Subject to any disclaimer, the term of this patent is extended or adjusted under 35 U.S.C. 154(b) by 228 days.

(21) Appl. No.: 12/554,950

(22) Filed: Sep. 7, 2009

(65) Prior Publication Data

US 2010/0079968 A1    Apr. 1, 2010

(30) Foreign Application Priority Data

Sep. 30, 2008    (TW) ............................... 97137580 A

(51) Int. Cl.
    *H01R 9/00*    (2006.01)
(52) U.S. Cl. ........ 361/774; 361/803; 361/767; 361/796; 439/83
(58) Field of Classification Search .................. 361/803, 361/796, 767, 736; 439/65, 83
    See application file for complete search history.

(56) References Cited

U.S. PATENT DOCUMENTS

| 6,736,647 | B1 * | 5/2004 | Gillenberg ....................... 439/65 |
| 7,227,759 | B2 * | 6/2007 | Grundy et al. ................. 361/785 |
| 2009/0213563 | A1 * | 8/2009 | Chen et al. .................... 361/803 |

* cited by examiner

*Primary Examiner* — Yuriy Semenenko
*Assistant Examiner* — Andargie M Aychillhum

(57) ABSTRACT

An improved upright circuit board assembly structure includes: an electronic component to be mounted on an external device so as for electrical functions of the electronic component to be used; and at least one circuit board including at least one first electrical connection portion and at least one second electrical connection portion. The first electrical connection portion and the second electrical connection portion are coupled to the external device by soldering with a solder paste. By soldering the circuit board to the external device in a double-sided, multi-point manner, the electronic component is mounted securely on the external device, and electric connection between the electronic component and the external device is enhanced.

6 Claims, 4 Drawing Sheets

UPRIGHT CIRCUIT BOARD ASSEMBLY STRUCTURE

CROSS-REFERENCE TO RELATED APPLICATION

This application claims foreign priority from a Taiwan Patent Application, Ser. No. 097137580, filed on Sep. 30, 2008.

BACKGROUND OF THE INVENTION

1. Technical Field

The present invention relates to an upright circuit board assembly structure and, more particularly, to an improved upright circuit board assembly structure in which at least one circuit board is soldered in a double-sided, multi-point manner to achieve strengthened physical connection and enhanced electrical connection between an electronic component and an external main printed circuit board.

2. Description of Related Art

A traditional printed circuit board (PCB) has a surface formed with specially designed electronic circuits and then mounted with different electronic components according to the circuit design, such that the functions of the electronic components can be used. The electronic components are arranged two-dimensionally on the traditional PCB and secured in position thereto by soldering the electrical soldering points of the electronic components to the PCB.

However, for certain electronic components, such as surface-mounted photo interrupters and side view LEDs, it is required that the PCB be fixed vertically on the assembly surface of an external device. Hence, an upright circuit board assembly structure has been successfully developed and is now in use.

Please refer to FIG. 1 and FIG. 2 for a partial side view and a perspective view of a conventional upright circuit board assembly structure, respectively. The conventional upright circuit board assembly structure includes an electronic component 2' and two circuit boards 5'.

The electronic component 2' has a coupling portion 21'. The coupling portion 21' has a first outer surface 211' and a second outer surface 212'.

Each circuit board 5' has a first surface 53' coupled to the first outer surface 211' or the second outer surface 212' of the coupling portion 21'. Since the first outer surface 211' and the second outer surface 212' are vertically extending surfaces, the circuit boards 5' are coupled respectively to the first outer surface 211' and the second outer surface 212' by means of a bonding substance. In addition, each circuit board 5' includes two first electrical connection portions 51'. The first electrical connection portions 51' are made of an electrically conductive metal and provided on a second surface 54' of each circuit board 5'. The first electrical connection portions 51' are soldered to an external device 3' via a solder paste 4' (tin solder). Thus, by soldering the circuit boards 5' to the external device 3' in a single-sided, two-point manner, the electronic component 2' is mounted on the external device 3'. The physical connection between the first electrical connection portions 51' and the external device 3' also maintains electrical connection between the electronic component 2' and the external device 3' such that electrical functions of the electronic component 2' can be used.

As shown in FIG. 2, while each of the circuit boards 5' is coupled to the external device 3' by soldering the two first electrical connection portions 51' on the second surface 54' to the external device 3', the soldering is performed only in a single-sided manner. Therefore, when the electronic component 2', such as a side view LED, having the conventional upright circuit board assembly structure is applied to a large outdoor LED bulletin board, solder joints between the first electrical connection portions 51' and the external device 3' are constantly subject to day/night temperature differences and moisture, which may cause the solder paste 4' to fall off gradually. When the electronic component 2', such as a side view LED, having the conventional upright circuit board assembly structure is applied to the backlight module of the LCD screen of a laptop computer or to the outer screen/backlight module of a cell phone, the shock and external force experienced by the laptop computer or cell phone while being carried around tend to affect the conventional upright circuit board assembly structure on a long-term basis. Consequently, the solder paste 4' used for the single-sided soldering may fall off, thus impairing the electrical connection between the electronic component 2' and the external device 3'. Even more seriously, the electronic component 2' itself may fall off from the external device 3', such that the electronic component 2' can no longer be used.

Besides, in the case where the electronic component 2' is a side view LED and applied to a large outdoor LED bulletin board, if the solder paste 4' gradually falls off due to the fact that the solder joints between the first electrical connection portions 51' and the external device 3' are subject to long-term day/night temperature differences and moisture, the malfunctioning electronic component 2' cannot be replaced or be repaired by re-soldering until the entire LED bulletin board is disassembled for maintenance. Such maintenance, however, is time-consuming, labor-intensive, and therefore undesirable.

Therefore, in view of the various shortcomings of the conventional upright circuit board assembly structure, the inventor of the present invention conducted extensive research and finally succeeded in developing an improved upright circuit board assembly structure as disclosed herein.

BRIEF SUMMARY OF THE INVENTION

A primary objective of the present invention is to provide an improved upright circuit board assembly structure, wherein a plurality of electrical connection portions are provided respectively on two surfaces of each of at least one circuit board and are soldered to an external device in a double-sided, multi-point manner. Thus, not only can an electronic component be coupled firmly to the external device, but also electrical connection between the electronic component and the external device is enhanced. As a result, a solder paste used in the soldering will not fall off due to external factors and cause the electronic component to also fall off from the external device.

To achieve the above and other objectives, the inventor of the present invention provides an improved upright circuit board assembly structure including an electronic component and at least one circuit board. The electronic component is to be mounted on an external device so that electrical functions of the electronic component can be used. In addition, the electronic component has a coupling portion for coupling with other electronic devices. The circuit board has a first surface coupled to the coupling portion and includes at least one first electrical connection portion and at least one second electrical connection portion. The first electrical connection portion is provided on a second surface of the circuit board, wherein the second surface is opposite to the first surface of the circuit board. Moreover, the first electrical connection portion is coupled to the external device by soldering with a solder paste. Thus, the electronic component is securely mounted on the external device, and electrical connection is established therebetween. The second electrical connection portion is provided on the first surface of the circuit board and is coupled to the external device by soldering with the solder paste. As the first electrical connection portion on the second surface of the circuit board and the second electrical connection portion on the first surface of the circuit board are soldered to the external device in a double-sided, multi-point manner, not only is the electronic component securely coupled to the external device, but also the electrical connection between the electronic component and the external device is enhanced by multi-point soldering.

BRIEF DESCRIPTION OF THE SEVERAL VIEWS OF THE DRAWINGS

The invention as well as a preferred mode of use, further objectives, and advantages thereof will be best understood by referring to the following detailed description of an illustrative embodiment in conjunction with the accompanying drawings, wherein.

DETAILED DESCRIPTION OF THE INVENTION

Figure 1:
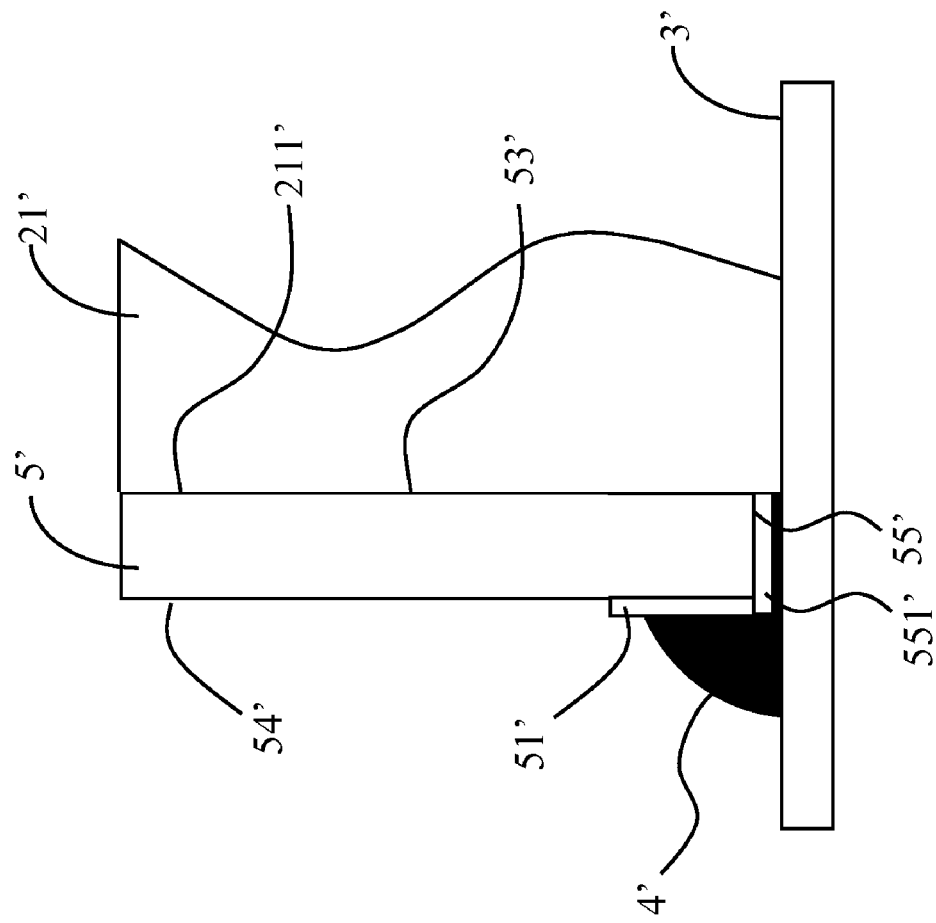
FIG. 1 is a partial side view of a conventional upright circuit board assembly structure.
Figure 2:
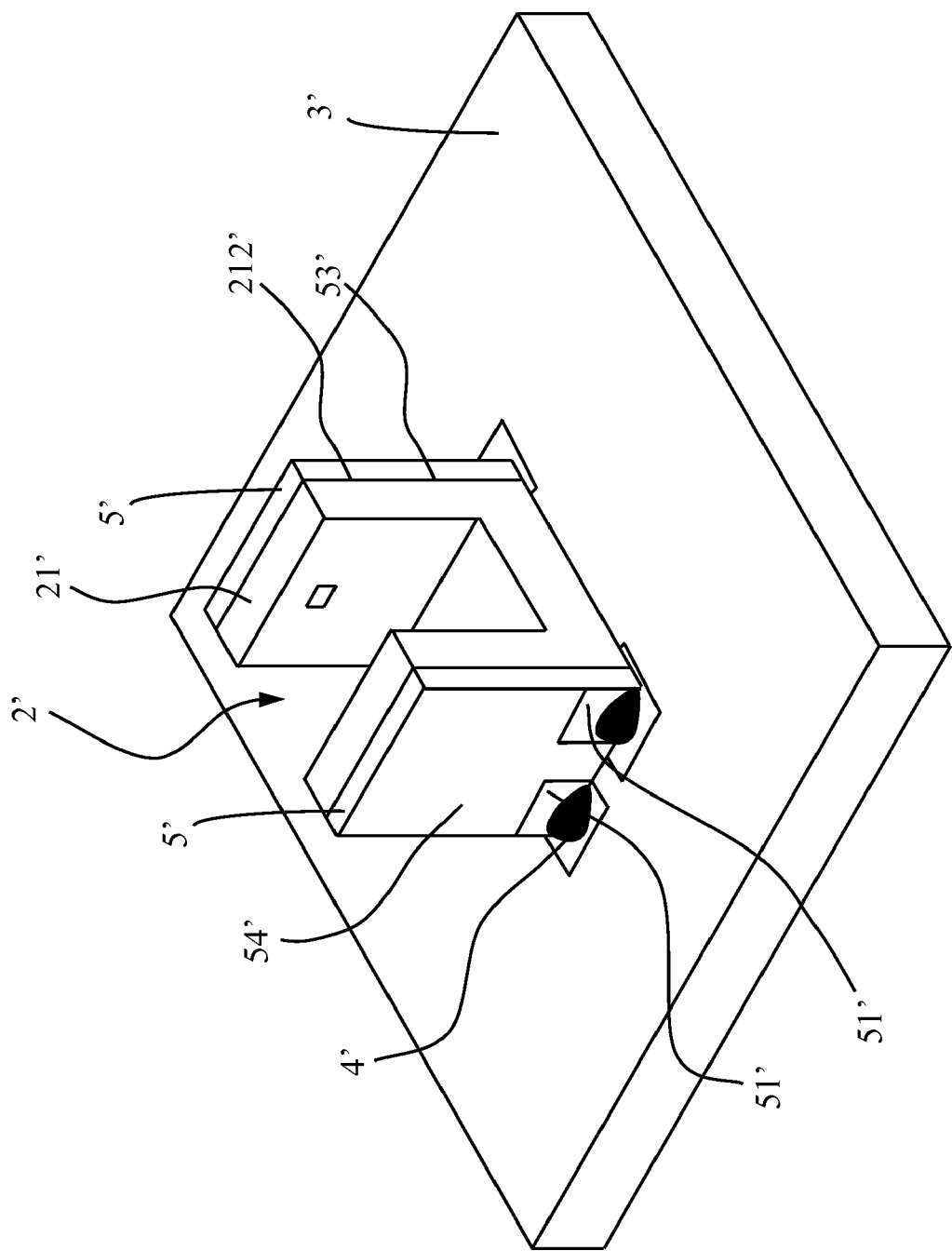
FIG. 2 is a perspective view of the conventional upright circuit board assembly structure.
Figure 3:
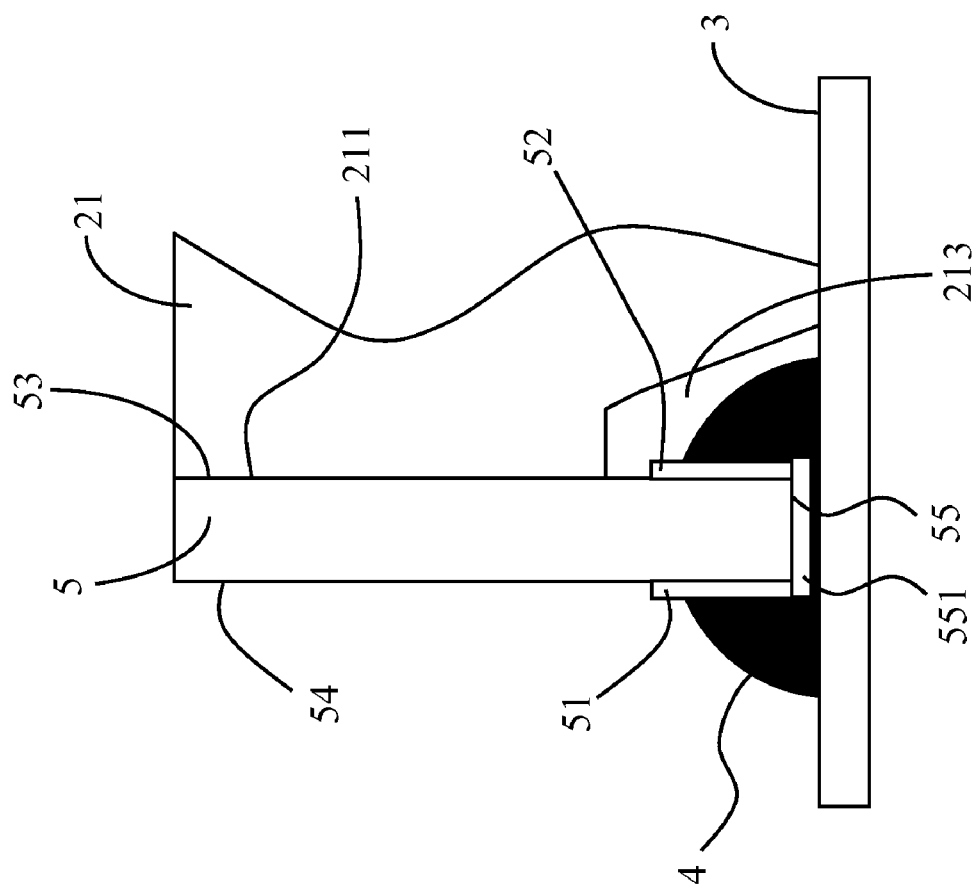
FIG. 3 is a partial side view of an improved upright circuit board assembly structure according to the present invention.
Figure 4:
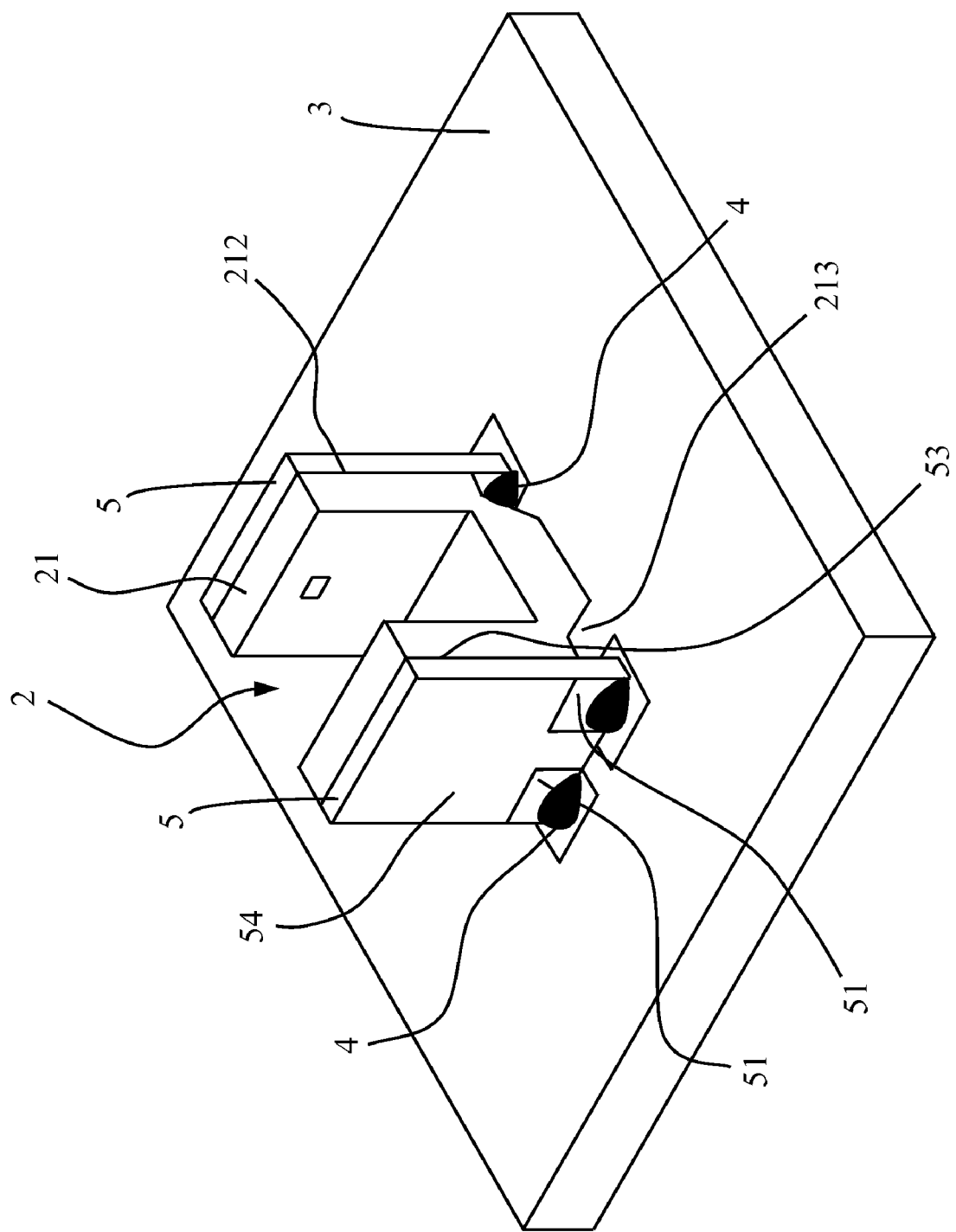
FIG. 4 is a perspective view of the improved upright circuit board assembly structure according to the present invention.

Referring to FIG. 3 and FIG. 4 for a partial side view and a perspective view of an improved upright circuit board assembly structure according to the present invention, respectively, the improved upright circuit board assembly structure includes an electronic component 2 and two circuit boards 5.

The electronic component 2 is a photo interrupter or a side view LED to be mounted on an external device 3, preferably a main PCB, so that electrical functions of the electronic component 2 can be used. The electronic component 2 has a coupling portion 21 for coupling with the two circuit boards 5.

Each circuit board 5 has a first surface 53 coupled to the coupling portion 21. Each circuit board 5 also includes two first electrical connection portions 51 and two second electrical connection portions 52. The two first electrical connection portions 51 of each circuit board 5 are provided on a second surface 54 thereof, wherein the second surface 54 is opposite to the first surface 53 of the circuit board 5. Each first electrical connection portion 51 is an electrically conductive metal plate. The first electrical connection portions 51 are coupled to the external device 3 by soldering with a solder paste 4 such that the electronic component 2 is mounted on and electrically connected to the external device 3. The two second electrical connection portions 52 of each circuit board 5 are provided on the first surface 53 thereof, and each second electrical connection portion 52 is an electrically conductive plate. The second electrical connection portions 52 are coupled to the external device 3 also by soldering with the solder paste 4. Thus, the first electrical connection portions 51 on the second surfaces 54 of the circuit boards 5, respectively, and the second electrical connection portions 52 on the first surfaces 53 of the circuit boards 5, respectively, are soldered to the external device 3 in a double-sided, multi-point manner.

By increasing the solder points between the circuit boards 5 and the external device 3, physical connection between the electronic component 2 and the external device 3 is effectively strengthened to prevent the solder paste 4 from falling off and causing the electronic component 2 to also fall off. Furthermore, electrical connection between the electronic component 2 and the external device 3 is enhanced by multi-point soldering, thus allowing the external device 3 to fully utilize the optimal electrical functions of the electronic component 2. Apart from that, the first surface 53 and the second surface 54 of each circuit board 5 can be provided with printed circuits to suit the applications of different electronic components 2. Moreover, each circuit board 5 has a bottom edge formed with two through holes 55. Each through hole 55 is provided therein with a metal layer 551. The metal layer 551 extends outward along two ends of each through hole 55 so as to connect the first electrical connection portion 51 and the second electrical connection portion 52 of each circuit board 5. With the through holes 55 connecting the corresponding first and second electrical connection portions 51, 52, the circuit boards 5 are coupled to the external device 3 even more securely.

In a preferred embodiment of the improved upright circuit board assembly structure, the coupling portion 21 further has a first outer surface 211, a second outer surface 212, and two recesses 213, wherein the second outer surface 212 is opposite to the first outer surface 211. Since the first outer surface 211 and the second outer surface 212 are both vertically extending surfaces, the two circuit boards 5 are coupled to the first outer surface 211 and the second outer surface 212, respectively, by means of a bonding substance. The recesses 213 are formed below the vertically extending surface of the first outer surface 211 and the vertically extending surface of the second outer surface 212, respectively, and correspond in position to the through holes 55. While each recess 213 may have a trapezoidal, triangular, rectangular, or arc shape, the recesses 213 in the present embodiment are formed with an arc shape. Formation of the recesses 213 creates gaps between the coupling portion 21 and the second electrical connection portions 52. These gaps facilitate soldering of the second electrical connection portions 52 to the external device 3 and thus enable double-sided soldering on both surfaces 53, 54 of each circuit board 5, thereby strengthening the connection between the electronic component 2 and the external device 3.

The improved upright circuit board assembly structure of the present invention has been clearly and fully disclosed by reference to the preferred embodiment. In short, the present invention provides the following advantages:

1. The two second electrical connection portions 52 on the first surface 53 of each circuit board 5 and the two first electrical connection portions 51 on the second surface 54 of each circuit board 5 are soldered to the external device 3 in a double-sided, multi-point manner so as to mount the electronic component 2 on the external device 3. The double-sided, multi-point soldering not only strengthens physical connection between the electronic component 2 and the external device 3, but also enhances electrical connection therebetween.

2. By forming the recesses 213, gaps are created between the coupling portion 21 and the second electrical connection portions 52 to facilitate soldering the second electrical connection portions 52 to the external device 3. Thus, double-sided soldering on both surfaces 53, 54 of each circuit board 5 can be achieved.

What is claimed is:

1. An improved upright circuit board assembly structure, comprising:
   an electronic component to be mounted on a main printed circuit board so as for electrical functions of the electronic component to be used, the electronic component having a coupling portion for coupling with other electronic devices,
   wherein the coupling portion comprises:
      a first outer surface configured as a vertically extending surface so as for the circuit board to be coupled to the first outer surface via a bonding substance;
      a second outer surface opposite the first outer surface and configured as a vertically extending surface so as for the circuit board to be coupled to the second outer surface via the bonding substance; and
      at least one recess formed below the vertically extending surface of the first outer surface and the vertically extending surface of the second outer surface, the recess forms a gap between the coupling portion and the second electrical connection element so as to facilitate soldering of the second electrical connection element to the main printed circuit board via the solder paste; and
   at least one circuit board having a first surface coupled to the coupling portion, the circuit board comprising:
      at least one first electrical connection element provided on a second surface of the circuit board, the second surface being opposite the first surface of the circuit board, wherein the first electrical connection element is coupled to the main printed circuit board by soldering with a solder paste, so as to mount the electronic component securely on the main printed circuit board and establish electrical connection between the electronic component and the main printed circuit board;
      at least one second electrical connection element provided on the first surface of the circuit board, wherein the second electrical connection element is coupled to the main printed circuit board by soldering with the solder paste, such that the first electrical connection element on the second surface of the circuit board and the second electrical connection element on the first surface of the circuit board are soldered to the main printed circuit board in a double-sided, multi-point manner, thereby not only effectively strengthening physical connection between the electronic component and the main printed circuit board, but also enhancing the electrical connection between the electronic component and the main printed circuit board via multi-point soldering; and
      at least one through hole corresponding in position to the recess, the through hole being provided therein with a metal layer, the metal layer extending outward along two ends of the through hole so as to connect the first electrical connection element and the second electrical connection element;
   wherein the first electrical connection elements on the second surfaces of the circuit boards, respectively, and the second electrical connection elements on the first surfaces of the circuit boards, respectively, are soldered to the main printed circuit board in a double-sided, multi-point manner;
   wherein the formation of the recesses creates gaps between the coupling portion and the second electrical connection elements, and these gaps facilitate soldering of the second electrical connection elements to the external device and thus enable the soldering of the double-sided on both surfaces of each circuit board, thereby strengthening the connection between the electronic component and the main printed circuit board.

2. The improved upright circuit board assembly structure of claim 1, wherein the electronic component is a photo interrupter or a side view LED.

3. The improved upright circuit board assembly structure of claim 1, wherein the first electrical connection element is an electrically conductive metal plate.

4. The improved upright circuit board assembly structure of claim 1, wherein the second electrical connection element is an electrically conductive metal plate.

5. The improved upright circuit board assembly structure of claim 1, wherein the recess is formed with a trapezoidal, triangular, rectangular, or arcuate shape.

6. The improved upright circuit board assembly structure of claim 1, wherein the first surface and the second surface of the circuit board are provided with printed circuits.

* * * * *